United States Patent
Otsuka

(10) Patent No.: US 6,737,912 B2
(45) Date of Patent: May 18, 2004

(54) RESISTANCE DIVISION CIRCUIT AND SEMICONDUCTOR DEVICE

(75) Inventor: Nobuaki Otsuka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/382,583

(22) Filed: Mar. 7, 2003

(65) Prior Publication Data

US 2003/0169098 A1 Sep. 11, 2003

(30) Foreign Application Priority Data

Mar. 8, 2002 (JP) ........................................ 2002-063220
Feb. 20, 2003 (JP) ........................................ 2003-042969

(51) Int. Cl.[7] .............................................. H01L 25/00
(52) U.S. Cl. ...................................................... 327/566
(58) Field of Search ................................ 327/427, 530, 327/564, 565, 566

(56) References Cited

U.S. PATENT DOCUMENTS 5,253,196 A 10/1993 Shimabukuro et al.
5,517,470 A 5/1996 Zanders et al.
5,589,790 A 12/1996 Allen
6,552,886 B1 * 4/2003 Wu et al. ...................... 361/56

* cited by examiner

Primary Examiner—Jeffrey Zweizig
(74) Attorney, Agent, or Firm—Oblon, Spivak, McClelland, Maier & Neustadt, P.C.

(57) ABSTRACT

A resistance division circuit disclosed herein has a first MIS transistor having a first gate terminal, a first source terminal, a first drain terminal and a first back gate terminal, wherein the first gate terminal is regarded as a first terminal, and the first source terminal, the first drain terminal and the first back gate terminal are regarded as a second terminal, and one of the first terminal and the second terminal is connected to a first node of a first voltage; and a second MIS transistor having a second gate terminal, a second source terminal, a second drain terminal and a second back gate terminal, wherein the second gate terminal is regarded as a third terminal, and the second source terminal, the second drain terminal and the second back gate terminal are regarded as a fourth terminal, and one of the third terminal and the fourth terminal is connected to the other of the first terminal and the second terminal and the other of the third terminal and the fourth terminal is connected to a second node of a second voltage.

27 Claims, 18 Drawing Sheets

RESISTANCE DIVISION CIRCUIT AND SEMICONDUCTOR DEVICE

CROSS REFERENCE TO RELATED APPLICATION

This application claims benefit of priority under 35 U.S.C. §119 to Japanese Patent Applications Nos. 2002-63220 and 2003-42969, filed on Mar. 8, 2002, and Feb. 20, 2003, respectively, the entire contents of which are incorporated by reference herein.

BACKGROUND OF THE INVENTION

1. Field of the Invention

The present invention relates to a resistance division circuit and a semiconductor device and, more particularly, to the resistance division circuit and the semiconductor circuit using a MIS transistor as a resistive element.

2. Description of the Related Art

It is generally performed in a semiconductor device to generate a reference voltage for a power control circuit or the like by its resistance division while very small current flows a resistive element having high resistance (FIG. 16) or to generate a comparison voltage for a voltage monitor while very small current flows through a resistive element having high resistance (FIG. 17). Specifically, in FIG. 16, a resistive element R1 and a resistive element R2 each of which has high resistance are connected in series between power voltage VDD and the ground, and a voltage is drawn from between the resistive element R1 and the resistive element R2 to generate the reference voltage. On the other hand, in FIG. 17, a P-channel MOS transistor P1 and a resistive element R3 and a resistive element R4, each of which has high resistance, are connected in series between power voltage VDD and the ground. Further, an amplifier OP, to which reference voltage VREF and the comparison voltage between the resistive element R3 and the resistive element R4 are inputted, is provided, and then output of this amplifier OP is inputted into a gate terminal of the P-channel MOS transistor P1. This allows to draw out a voltage from between the P-channel MOS transistor P1 and the resistive element R3, thereby an output voltage is generated.

In a reference voltage generating circuit shown in FIG. 16 and an output voltage generating circuit shown in FIG. 17, a through current passes from the power voltage VDD to the ground, which directly causes an increase in current consumption in accordance with the through current. Therefore, in a path or the like that requires the through current also in a standby mode, reduction in power consumption becomes more important than a current driving force, so that it is sometimes desired to pass the through current as little as possible. Practically in this case, a current value may be reduced to about 100 nA or below. Suppose that a power source level is, for example, 1.8 V, it is required to have a resistive element having a high resistance value of 18 MΩ in order to reduce the current down to 100 nA.

Conventionally, a polysilicon layer formed on a semiconductor substrate and an impurity diffused layer formed in the semiconductor substrate are used for the resistive element having such high resistance. Additionally used is such on-resistance that passes from an input terminal of a MOS transistor to an output terminal thereof when the MOS transistor is set to an ON-state.

Typical sheet resistance is several dozens Ω/□ when forming the resistive element having high resistance with the polysilicon layer and the impurity diffused layer. Therefore, for example, forming the above-mentioned resistive element of 18 MΩ by 30 Ω/□ results in 600000 sheets, that is, 600000-fold length (in this case, 300000 μm=0.3 m) against width of a resistance layer (for example, 0.5 μm), which is not realistic in terms of an occupied area alone. Therefore, resistance realized by using the polysilicon layer and the impurity diffused layer is limited in such a case as that the current can flow with a little less resistance.

As described above, the resistive element having high resistance of about megohm requires a polysilicon layer and an impurity diffused layer in which impurity concentration is decreased to intentionally increase the resistance value. This can be achieved in an impurity implantation process by first masking regions except for a region in which the resistive element is formed, and then implanting impurities thereon with different concentration from other regions. This particular process, however, involves a problem that a process cost in the semiconductor device may increase.

In a case where a process of forming an impurity diffused layer having low concentration, which is used in an LDD structure, can be directly applied to a process of forming the resistive element, the sheet resistance becomes hundred to thousand times as high a value as a resistance value obtained when a normal impurity diffused layer is used. This enables to avoid an increase in the process cost, but it is undeniable that this resistive element still occupies considerable area on the semiconductor substrate.

Further, a recent salicide technology has developed to attach a layer having low resistance on the polysilicon layer and the impurity diffused layer. This involves a problem that the low resistance layer is similarly attached to the above-mentioned impurity diffused layer having the low concentration, which results in lowering the sheet resistance. In addition, when the salicide technology is set as a standard process, such a particular process is further required as to avoid salicide-forming only on a portion of the resistive element having high resistance, or to remove the formed salicide layer.

On the other hand, in a case of realizing high resistance by the on-resistance of the MOS transistor, current is reduced by narrowing down channel width W and by having gate length L rather long to set a W/L small. However, the on-resistance of a normal MOS transistor has about several K ohms per the channel width, so that realizing high resistance of 18 MΩ results in setting the gate length L to unrealistic length.

An increase in resistance may also be realized by setting a gate voltage to a voltage that barely manages to conduct the MOS transistor to reduce the current. In order to generate this gate voltage, however, a circuit for generating an intermediate voltage is separately required.

SUMMARY OF THE INVENTION

In order to accomplish the aforementioned and other objects, according to one aspect of the present invention, a resistance division circuit, comprises:

a first MIS transistor having a first gate terminal, a first source terminal, a first drain terminal and a first back gate terminal, wherein the first gate terminal is regarded as a first terminal, and the first source terminal, the first drain terminal and the first back gate terminal are regarded as a second terminal, and one of the first terminal and the second terminal is connected to a first node of a first voltage; and a second MIS transistor having a second gate terminal, a second source terminal, a second drain terminal and a second back gate terminal, wherein the second gate terminal is regarded as a third terminal, and the second source terminal, the second drain terminal and the second back gate terminal are regarded as a fourth terminal, and one of the third terminal and the fourth terminal is connected to the other of the first terminal and the second terminal and the other of the third terminal and the fourth terminal is connected to a second node of a second voltage.

According to another aspect of the present invention, a semiconductor device including a first MIS transistor and a second MIS transistor, wherein the first MIS transistor comprises:
  a first well region formed in a surface side of a semiconductor substrate, the first well being connected to one of a first node of a first voltage and an output node;
  a first source region formed in the surface side of the first well region, the first source region being connected to the one of the first node and the output node;
  a first drain region formed in the surface side of the first well region, the first drain region being connected to the one of the first node and the output node; and
  a first gate electrode formed on the first well region between the first source region and the first drain region via a first insulating film, the first gate electrode being connected to the other of the first node and the output node, and the second MIS transistor comprises:
  a second well region formed in the surface side of the semiconductor substrate, the second well being connected to one of the output node and a second node of a second voltage;
  a second source region formed in the surface side of the second well region, the second source region being connected to the one of the output node and the second node;
  a second drain region formed in the surface side of the second well region, the second drain region being connected to the one of the output node and the second node; and
  a second gate electrode formed on the second well region between the second source region and the second drain region via a second insulating film, the second gate electrode being connected to the other of the output node and the second node.

According to a further aspect of the present invention, a semiconductor device, comprising a MIS transistor having a gate terminal, a source terminal, a drain terminal and a back gate terminal, wherein the gate terminal is regarded as a first terminal, and the source terminal, the drain terminal and the back gate terminal are regarded as a second terminal, one of the first terminal and the second terminal being connected to a first node, while the other of the first terminal and the second terminal being connected to a second node; and wherein the MIS transistor is used as a resistive element.

DETAILED DESCRIPTION OF THE EMBODIMENT

First Embodiment

A leak current in a MOS transistor principally involves a sub-threshold leak current flowing between a source and a drain. Nowadays, however, a process technology, for example, called 0.1 $\mu$m generation has achieved a gate insulating film having a film thickness of about 2 nm. This causes a gate insulating film leak current flowing through the gate insulating film to have a significant value that has reached a level not negligible in terms of its characteristics.

Figure 1:
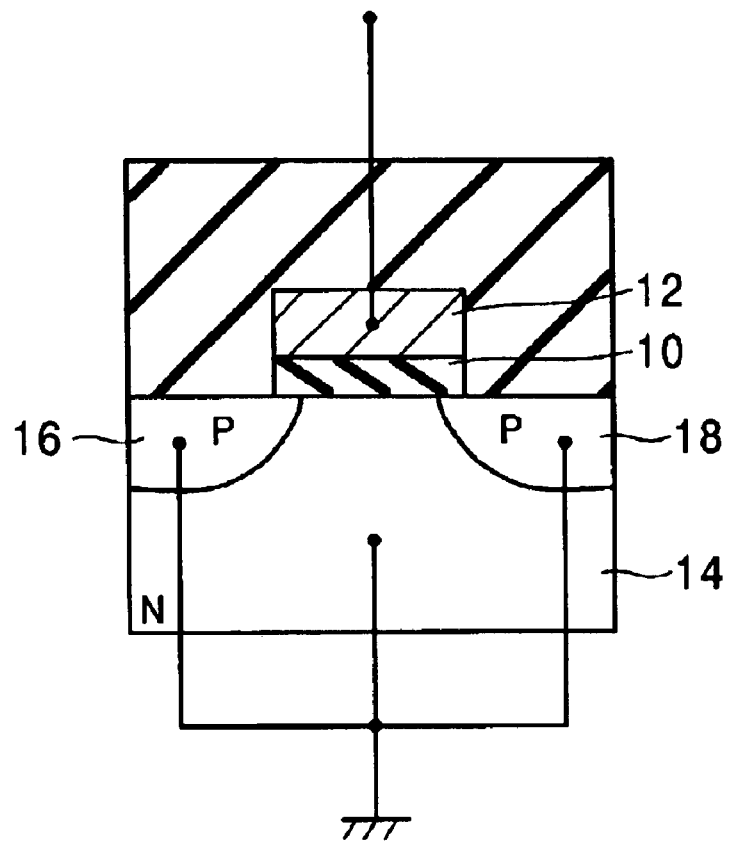
FIG. 1 is a diagram to describe connecting relations in a case of using a MOS transistor as a resistive element an embodiment.

For example, as shown in FIG. 1, the MOS transistor is supposed to have a gate insulating film 10 having an area of 10 $\mu m^2$. 1.5 V is applied to a gate electrode 12 and a semiconductor substrate 14, a source region 16, and a drain region 18 are grounded. As a result, an actual measured value indicates that the gate insulating film leak current of about several 100 nA flows between the gate electrode 12 and the ground.

Figure 2:
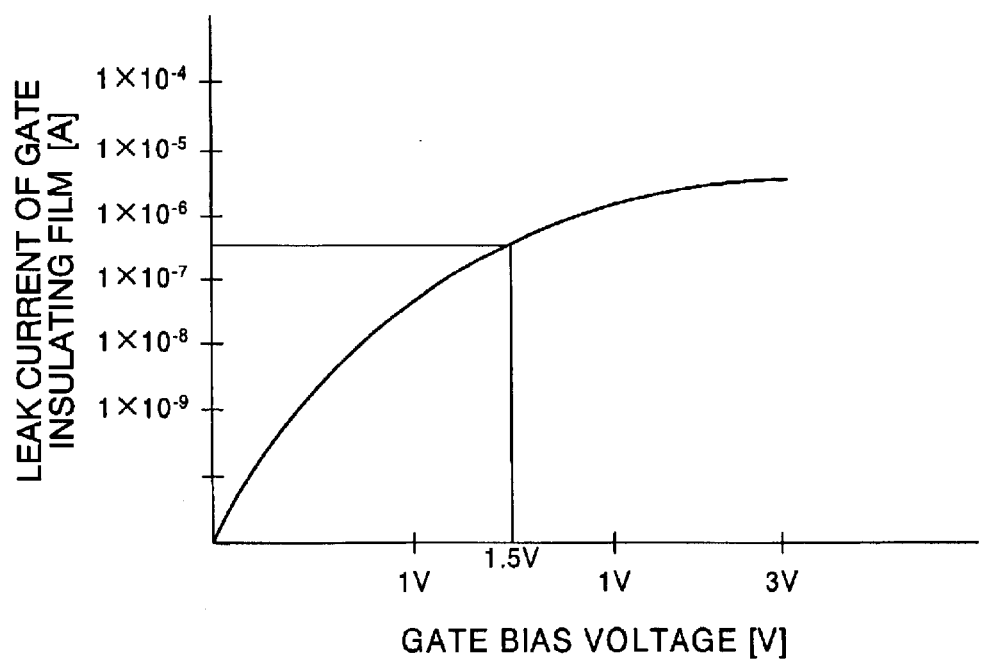
FIG. 2 is a graph showing relations between gate bias voltage and a gate insulating film leak current in the MOS transistor shown in FIG. 1.

FIG. 2 is a graph showing relations between a gate bias voltage which is a voltage to apply to the gate electrode 12 and the gate insulating film leak current. The example in FIG. 2 shows that this MOS transistor corresponds to a resistive element of 5 MΩ when a voltage of 1.5 V is applied to the gate electrode 12. This means that a resistive element having desired high resistance of about mega Ω is realized by the MOS transistor that has the gate insulating film 10 of its area being about several $\mu m^2$. This embodiment is to rather positively utilize this gate insulating film leak current that arises from making the gate insulating film 10 thin.

Figure 3:
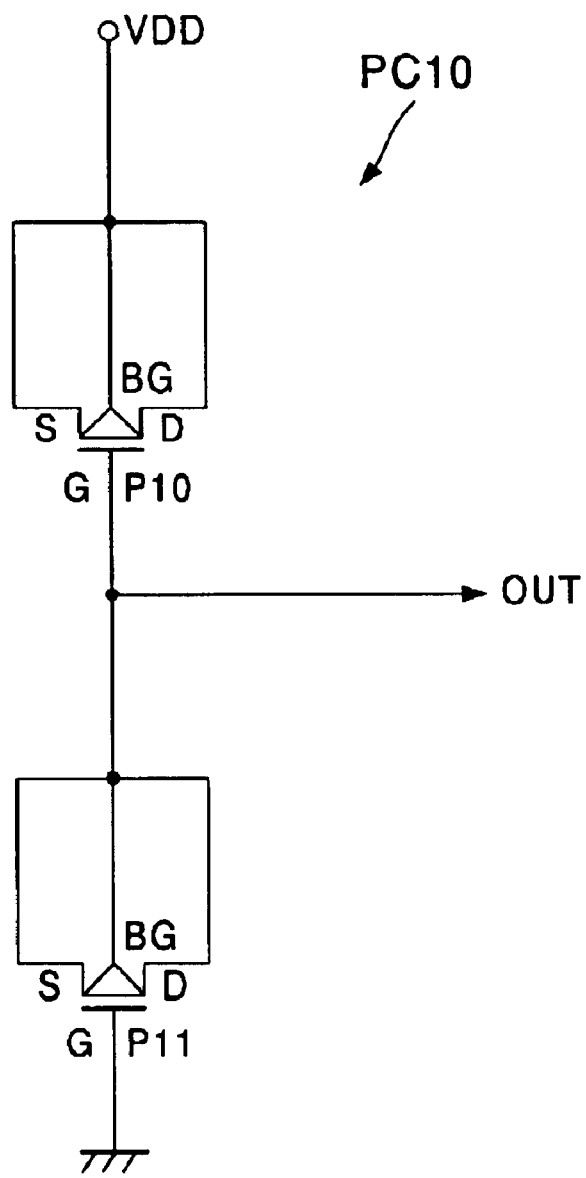
FIG. 3 is a circuit diagram of a voltage generating circuit according to a first embodiment.

In practice, it is necessary to connect the resistive elements in series as shown in FIG. 3 to compose a voltage generating circuit with a resistance division circuit that performs resistance division. Specifically, a voltage generating circuit PC10 shown in FIG. 3 includes a P-channel MOS transistor P10 and a P-channel MOS transistor P11. A source terminal S, a drain terminal D, and a back gate terminal BG of the MOS transistor P10 are commonly connected to power supply voltage VDD (a first voltage node). A gate terminal G of the MOS transistor P10 is commonly connected to a source terminal S, a drain terminal D, and a back gate terminal BG of a MOS transistor P11. The gate terminal G of the MOS transistor P11 is connected to the ground (a second voltage node). Then, a node between the MOS transistor P10 and the MOS transistor P11 becomes an output node for outputting intermediate voltage output OUT.

Figure 4:
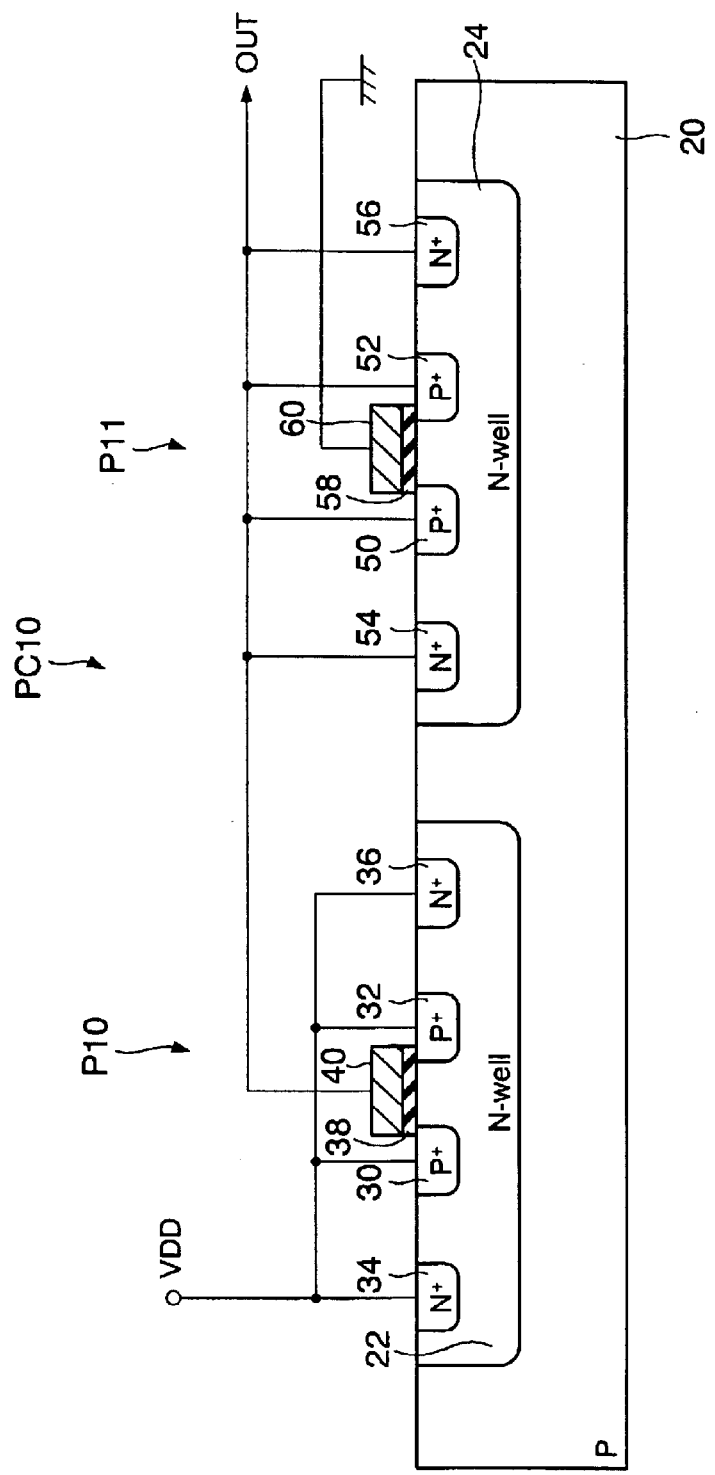
FIG. 4 is a sectional view in a case where the voltage generating circuit according to the first embodiment is formed in a semiconductor device.

FIG. 4 is a schematic view showing a cross section of a semiconductor device of the voltage generating circuit PC10 shown in FIG. 3. As shown in FIG. 4, in a CMOS process using a P-type semiconductor substrate 20, N-type wells 22 and 24 are formed in a surface side of the P-type semiconductor substrate 20, and then the P-channel MOS transistor P10 is formed in the N-type well 22, while the P-channel MOS transistor P11 is formed in the N-type well 24.

Specifically, the MOS transistor P10 includes a $P^+$-type source region 30, a $P^+$-type drain region 32, an $N^+$-type contact region 34, and an $N^+$-type contact region 36, which are formed in a surface side of the N-channel well 22. A gate insulating film 38 is formed on the well 22 between the source region 30 and the drain region 32, and a gate electrode 40 is formed on this gate insulating film 38.

Similarly, the MOS transistor P11 includes a $P^+$-type source region 50, a $P^+$-type drain region 52, an $N^+$-type contact region 54, and an $N^+$-type contact region 56, which are formed in a surface side of the N-type well 24. A gate insulating film 58 is formed on the well 24 between the source region 50 and the drain region 52, and a gate electrode 60 is formed on this gate insulating film 58.

The source region 30, the drain region 32, the contact region 34, and the contact region 36 of the MOS transistor P10 are connected to the power supply voltage VDD. The gate electrode 40 of the MOS transistor P10, the source region 50, the drain region 52, the contact region 54, and the contact region 56 of the MOS transistor P11 are connected to the output node outputting the intermediate voltage output OUT. The gate electrode 60 of the MOS transistor P11 is connected to the ground. Here, the power supply voltage VDD has higher voltage than the ground.

In FIG. 4, when a voltage level of the intermediate voltage output OUT is half of the power supply voltage VDD, the MOS transistor P10 and the MOS transistor P11 may be formed to be equal in size.

In a case of setting the voltage level of the intermediate voltage output OUT to a level other than the above, an area ratio of the gate insulating film 38 on the MOS transistor P10 to the gate insulating film 58 of the MOS transistor P11 may be adjusted. Making a difference in area between the gate insulating films 38 and 58, however, results in causing a gap between voltages applied to the two gate insulating films. In this case, as shown in FIG. 2, the characteristics of the gate insulating film leak current is not linear to voltage, which naturally leads to a fact that a ratio between the gate insulating film leak current of the two MOS transistors P10 and P11 is not in proportion to the area ratio thereof. Therefore, it is necessary to consider the characteristics of the gate insulating film leak current of the MOS transistor and the voltage applied to the gate electrode to set the difference in area between the gate insulating films 38 and 58.

In order to reduce variations in the gate insulating film leak current by the MOS transistors, it is desirable that the MOS transistor is in an ON-state and a channel is formed under the gate electrode thereof. Therefore, a difference between a voltage applied to the gate electrode of the MOS transistor and a voltage applied to the back gate of the MOS transistor may preferably have a value equal to or more than the threshold of the MOS transistor. This conversely means that it is desirable to choose as low a threshold as possible for that of the MOS transistor. Specifically, when plural kinds of the MOS transistors having different thresholds are formed in the semiconductor device, it is preferable to use, among the plural MOS transistors, the MOS transistor having the least threshold as the resistive element according to the present embodiment.

In addition, even when the thickness of the gate insulating films 10 is not uniform within a surface of a wafer, the thickness of the gate insulating film 10 of the MOS transistor P10 is substantially equal to the thickness of the gate insulating film 10 of the MOS transistor P11 because the MOS transistor P10 and the MOS transistor P11 are formed close to each other. Therefore, it is considered that the voltage level of the intermediate voltage output OUT seldom or never varies.

Moreover, the resistance values of the MOS transistors P10 and P11, which form resistive elements, are defined by electric field, so that the resistance values do not vary according to temperature. Therefore, good temperature characteristics can be obtained.

As described above, the semiconductor device according to this embodiment positively makes use of the gate insulating film leak current that passes between the gate electrode and the back gate of the MOS transistor, so as to use the MOS transistor as the resistive element having high resistance. Using such a MOS transistor can realize the resistive element having high resistance without adding an extra process to a semiconductor device manufacturing process.

This also allows to realize the resistive element having high resistance with small area, comparing to a conventional case of using an impurity diffused layer as the resistive element or using a polysilicon layer as the resistive element.

Second Embodiment

In a second embodiment, the plural voltage generating circuits according to the above-described first embodiment are provided in parallel and output nodes are commonly connected, so that the MOS transistors being the resistive elements in the voltage generating circuits can be selectively used, which enables to adjust a voltage obtained from the output node and to make the voltage variable.

Figure 5A:
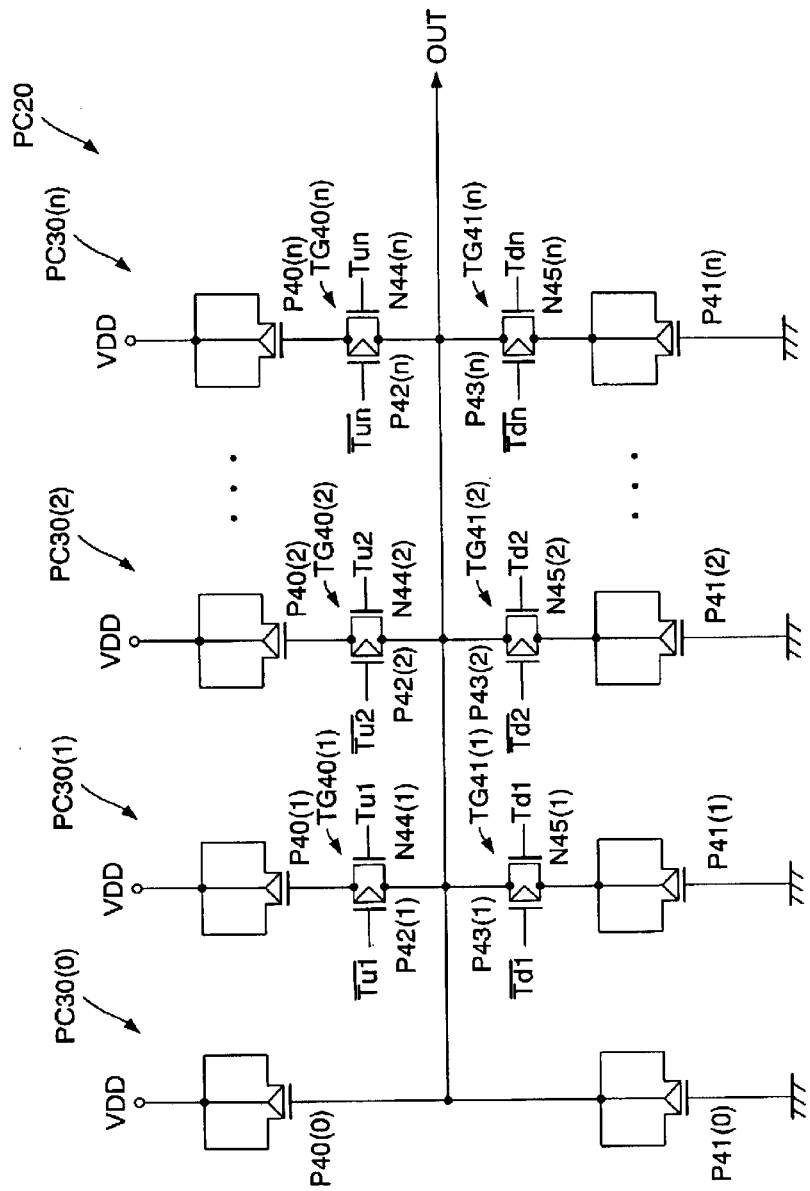
FIG. 5A is a circuit diagram of a voltage generating circuit according to a second embodiment.

FIG. 5A is a circuit diagram showing a structure of a voltage generating circuit PC20 according to this embodiment. As shown in FIG. 5A, the voltage generating circuit PC20 according to this embodiment is composed by connecting plural voltage generating circuits PC30(0) to PC30(n) in parallel.

The voltage generating circuit PC30(0) has a structure equal to the voltage generating circuit PC20 in the above-described first embodiment. The output node of this voltage generating circuit PC30(0) is connected commonly to the output nodes of the voltage generating circuits PC30(1) to PC30(n). This output node becomes a node outputting intermediate voltage output OUT.

The voltage generating circuit PC30(1) has a transfer gate TG40(1) connected between the output node and a P-channel MOS transistor P40(1). This transfer gate TG 40(1) includes a P-channel MOS transistor P42(1) and an N-channel MOS transistor N44(1).

A source terminal of the MOS transistor P42(1) is connected to a gate terminal of the MOS transistor 40(1), while its drain terminal is connected to the output node. Inputted into the gate terminal of the MOS transistor P42(1) is an inverted trimming signal/Tu1 inverting a trimming signal Tu1.

A drain terminal of the MOS transistor N44(1) is connected to the gate terminal of the MOS transistor P40(1), while its source terminal is connected to the output node. Inputted into the gate terminal of the MOS transistor N44(1) is the trimming signal Tu1.

Further, the voltage generating circuit PC30(1) has a transfer gate TG41(1) connected between the output node and a P-channel MOS transistor P41(1). This transfer gate TG41(1) includes a P-channel MOS transistor P43(1) and an N-channel MOS transistor N45(1).

A source terminal of the MOS transistor P43(1) is connected to the output node, while its drain terminal is connected to a source terminal, a drain terminal, and a back gate terminal of the MOS transistor P41(1). Inputted into the gate terminal of the MOS transistor P43(1) is the inverted trimming signal/Td1 inverting the trimming signal Td1.

A drain terminal of the MOS transistor N45(1) is connected to the output node, while its source terminal is connected to the source terminal, the drain terminal, and the back gate terminal of the MOS transistor P41(1). Inputted into the gate terminal of the MOS transistor N45(1) is the trimming signal Td1.

Figure 5B:
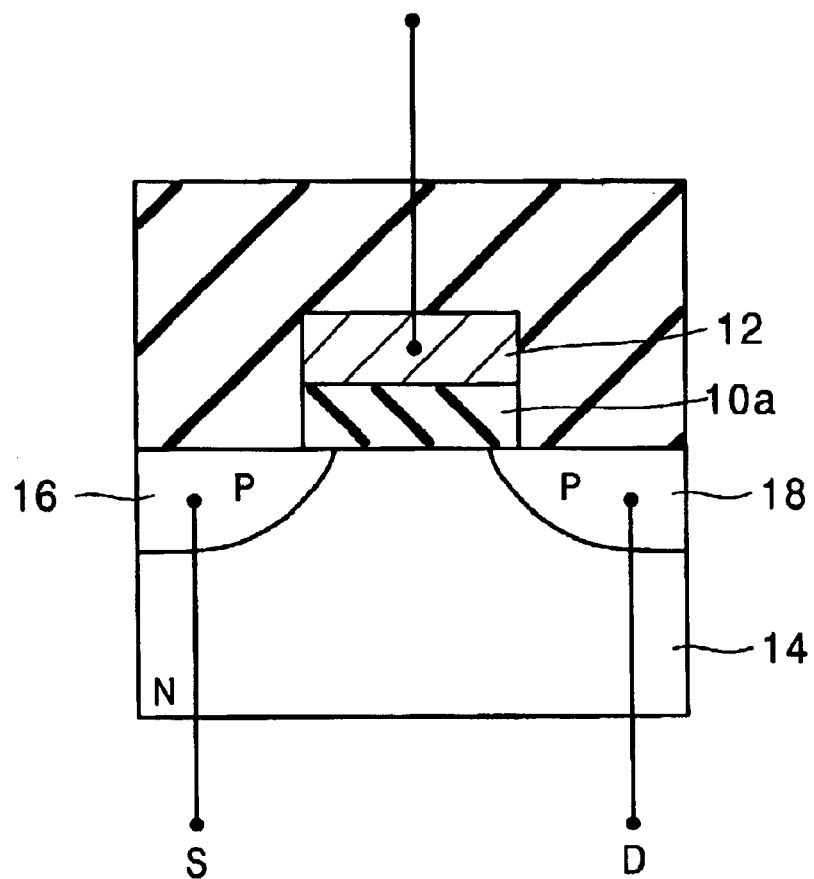
FIG. 5B is a sectional view of a P-channel MOS transistor used in a transfer gate of FIG. 5A.
Figure 5C:
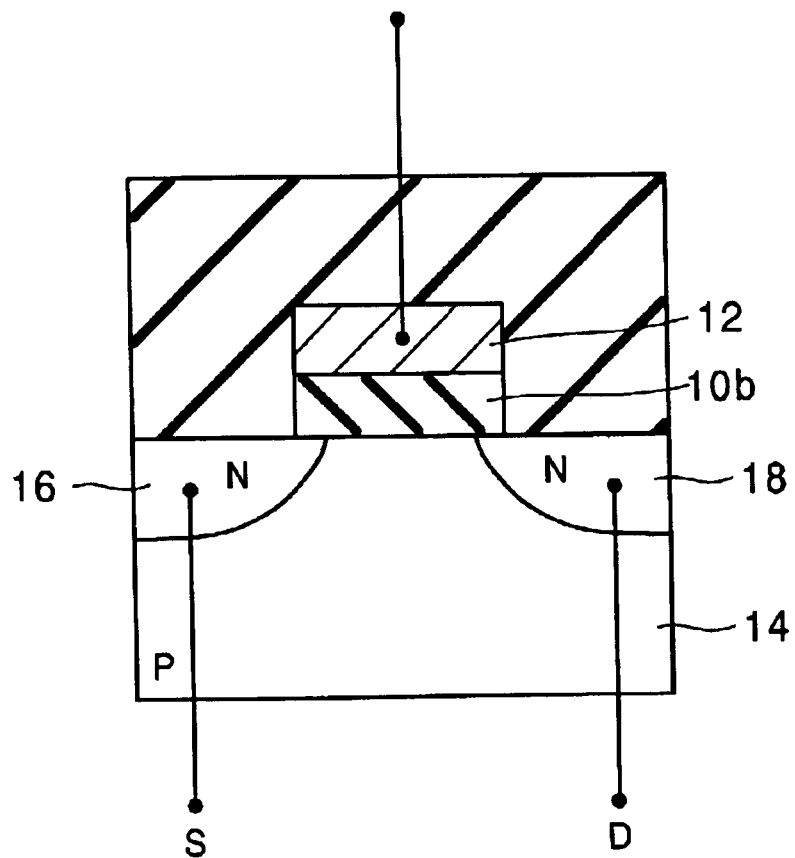
FIG. 5C is a sectional view of an N-channel MOS transistor used in a transfer gate of FIG. 5A.

Moreover, in this embodiment, the thickness of the gate insulating films of the MOS transistors P42(1), P43(1), N44(1) and N45(1) is thicker than the thickness of the gate insulating films 10 of the MOS transistors P40(1) and P41(1) which form the resistive element. Specifically, as shown in FIG. 5B, each of the P-type MOS transistors P42(1) and P43(1) is formed out of a MOS transistor with thick gate insulating film 10a, whereas as shown in FIG. 5C, each of the N-type MOS transistors P44(1) and P45(1) is formed out of a MOS transistor with thick gate insulating film 10b.

The reason why the MOS transistors constituting the transfer gates TG40(1) and TG41(1) are formed out of the MOS transistors with thick gate insulating films is that the gate insulating film leak current flows, if the gate insulting film is thin. If the gate insulating film leak current flows from the MOS transistors constituting the transfer gates TG40(1) and TG41(1), then the voltage of the intermediate voltage output OUT is also changed under this influence and it is not desirable.

However, if there is no problem of circuit design even when the gate insulating film leak current flows from the MOS transistors constituting transfer gates TG40(1) and TG41 (1), the thickness of the gate insulating films of the MOS transistors P42(1), P43(1), N44(1) and N45(1) may be the same as the thickness of the gate insulating films 10 of the MOS transistors P40(1) and P41(1).

Although other voltage generating circuits PC30(2) to PC30(n) also have the structure equal to that of the voltage generating circuit PC30 (1), they differ in that the trimming signal Tu2, the inverted trimming signal/Tu2, the trimming signal Td2, and the inverted trimming signal/Td2 are inputted into the transfer gates TG40(2) and TG41(2), and the trimming signal Tun, the inverted trimming signal/Tun, the trimming signal Tdn, and the inverted trimming signal/Tdn are inputted into the transfer gates TG40(n) and TG41(n), respectively.

The trimming signals Tu1 to Tun, the inverted trimming signals/Tu1 to /Tun, the trimming signals Td1 to Tdn, and the inverted trimming signals/Td1 to /Tdn are the signals for controlling the number of the P-channel MOS transistors to be connected to the output nodes. For example, when the trimming signal Tu1 becomes a high level, the inverted trimming signal/Tu1 becomes a low level, which makes the transfer gate TG40(1) into a continuity state. This enables the MOS transistor P30 to be connected to the output node.

In this embodiment, the number of the voltage generating circuits PC30(1) to PC30(n) to be connected in parallel, namely, a value of a variable n is optional. The MOS transistors P40(1) to P40(n) in the voltage generating circuits PC30(1) to PC30(n) may be equal, or may daringly differ in size to each other. The same applies to the MOS transistors P41(1) to P41(n). In addition, the MOS transistors P40(1) to P40(n) and the MOS transistors P41(1) to P41(n) may be equal, or may daringly differ in size.

In order to expand the scope of generable voltages by the voltage generating circuit PC20, the size of the MOS transistors can be set to have the second power thereof as follows.

$$\text{SIZE}(P40(X+1)) = 2 \times \text{SIZE}(P40(X))$$

$$\text{SIZE}(P41(X+1)) = 2 \times \text{SIZE}(P41(X))$$

Here, SIZE(P40(X)) designates size of the MOS transistor P40(X), while SIZE(P41(X)) designates size of the MOS transistor P41(X). In addition, X equals to 1 to n−1. In this example, the size of the MOS transistors is set to have the second power thereof, but it can be set to have the third power, the fourth power, to the yth power thereof.

In general, in regard to thickness of MOS transistors forming an integrated circuit, thickness of MOS transistors used in an interface circuit for the outside of the integrated circuit and so on is thicker than thickness of MOS transistors used in an internal logic circuit of the integrated circuit. Because, in order to ensure connectivity for other circuit in the outside, it is necessary for the interface circuit to be driven at a voltage higher than an internal circuit. Therefore, the transfer gates TG40(1) to TG40(n) and TG41(1) to TG41(n) in this embodiment can be formed in the process for forming the thick MOS transistors constituting the interface circuit and so on. Hence, even when there are two kinds of MOS transistors having different thickness of the gate insulating films in one integrated circuit, it is considered that the number of manufacturing process step does not increase.

As described above, the semiconductor device according to this embodiment controls the number of the MOS transistors, which are connected to the output nodes for outputting the intermediate voltage output OUT, with the use of the trimming signals Tu1 to Tun, the inverted trimming signals/Tu1 to /Tun, the trimming signals Td1 to Tdn, and the inverted trimming signals/Td1 to /Tdn. This allows to adjust the voltage level of the intermediate voltage output OUT.

Therefore, even when a predetermined voltage level of the intermediate voltage output can not be obtained because of variations of the thickness of the gate insulating film of the MOS transistor, the voltage level thereof can be adjusted by appropriately setting the level of the trimming signals Tu1 to Tun, the inverted trimming signals/Tu1 to /Tun, the trimming signals Td1 to Tdn, and the inverted trimming signals/ Td1 to /Tdn.

Owing to variations of the manufacturing process, there is a possibility that the voltage level of the intermediate voltage output is different in each chip. However, in this embodiment, each chip can be trimmed with the trimming signals Tu1 to Tun, the inverted trimming signals/Tu1 to /Tun, the trimming signals Td1 to Tdn, and the inverted trimming signals/Td1 to /Tdn, so that the variations of the voltage level can be compensated.

Furthermore, as shown in FIG. 2, the relationship between the gate bias voltage and the gate insulating film leak current in the MOS transistor is not linear. However, in this embodiment, the voltage level of the intermediate voltage output OUT is adjusted by trimming, so that it is not so difficult to adjust the voltage level of the intermediate voltage output OUT in spite of the non-linearity of the MOS transistor.

Third Embodiment

A third embodiment employs a voltage generating circuit including an N-channel MOS transistor instead of the P-channel MOS transistor used in the above-described first embodiment.

Figure 6:
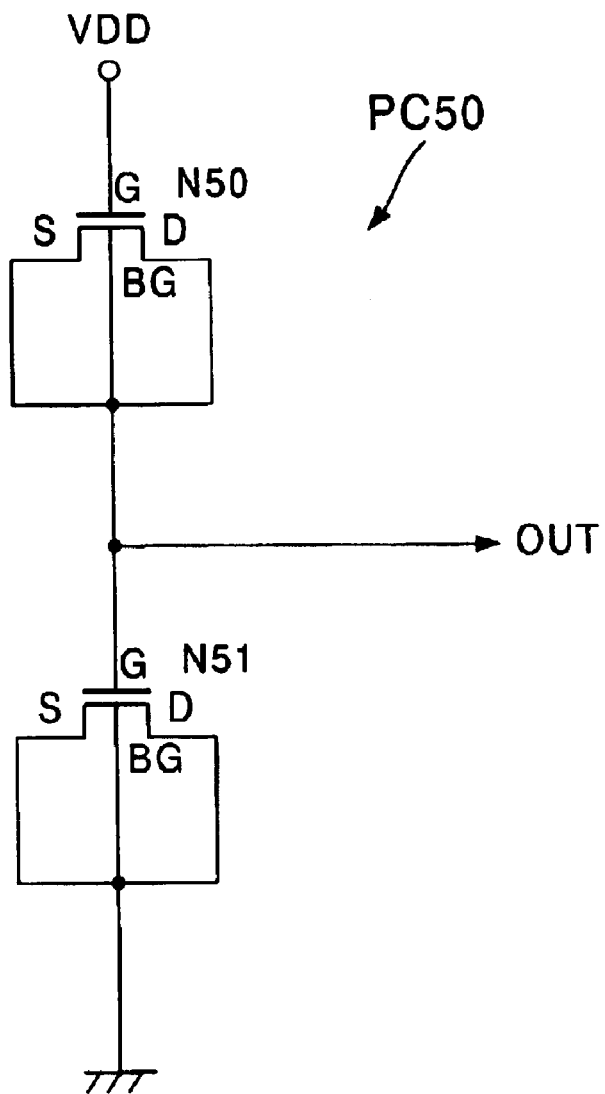
FIG. 6 is a circuit diagram of a voltage generating circuit according to a third embodiment.

FIG. 6 is a circuit diagram showing a structure of a voltage generating circuit PC50 according to this embodiment. As shown in FIG. 6, the voltage generating circuit PC50 according to this embodiment includes an N-channel MOS transistor N50 and an N-channel MOS transistor N51. A gate terminal G of the MOS transistor N50 is connected to power supply voltage VDD. A source terminal S, a drain terminal D, and a back gate terminal BG of the MOS transistor N50 are commonly connected to the gate terminal G of the MOS transistor N51.

A source terminal S, a drain terminal D, and a back gate terminal BG of the MOS transistor N51 are commonly connected to the ground. Then, a node between the MOS transistor N50 and the MOS transistor N51 becomes an output node for outputting intermediate voltage output OUT.

Figure 7:
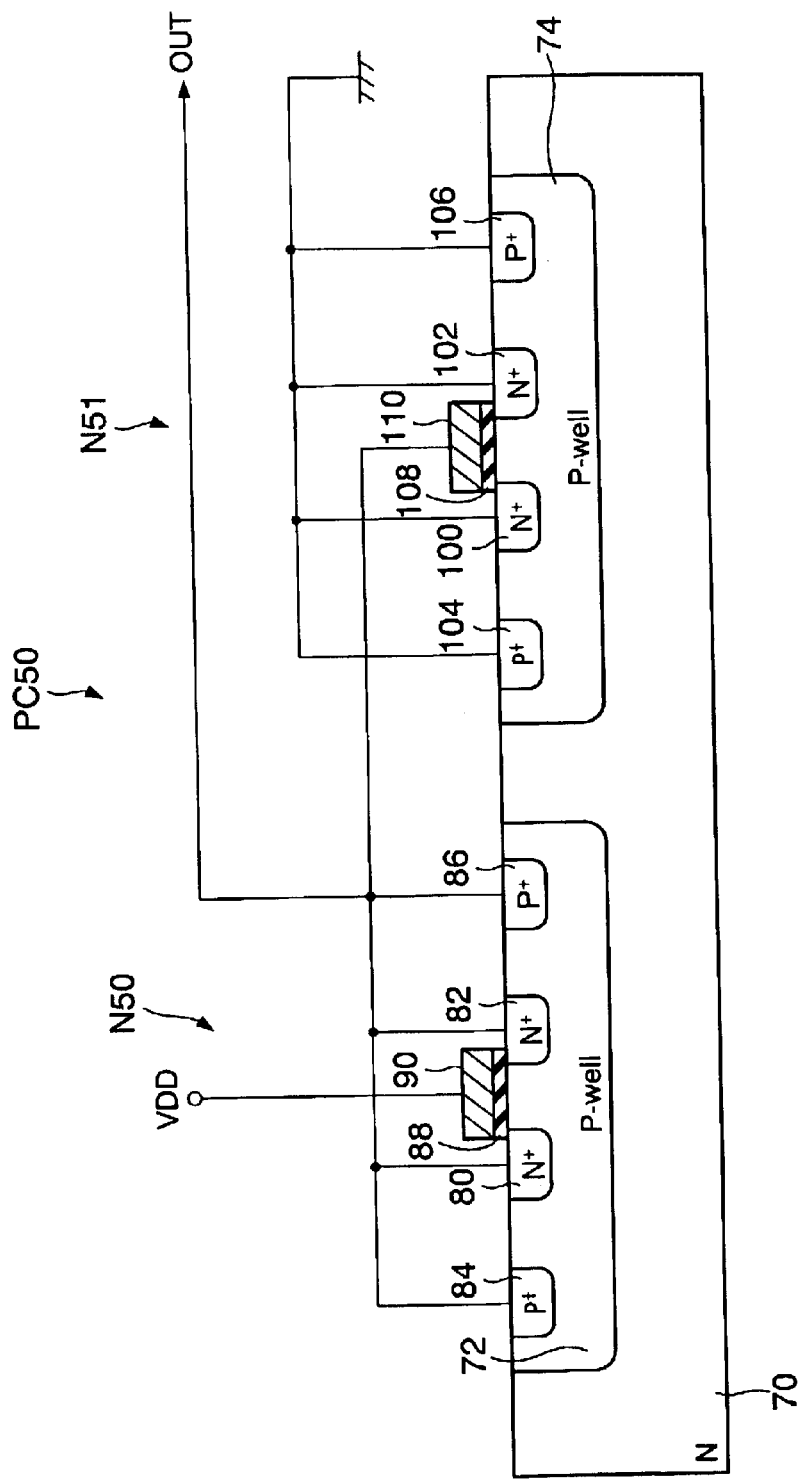
FIG. 7 is a sectional view in a case where the voltage generating circuit according to the third embodiment is formed in a semiconductor device.

FIG. 7 is a schematic view showing a cross section of a semiconductor device of the voltage generating circuit PC50 shown in FIG. 6. As shown in FIG. 7, in a CMOS process using an N-type semiconductor substrate 70, P-type wells 72 and 74 are formed in a surface side of the N-type semiconductor substrate 70, and then the N-channel MOS transistor N50 is formed in the P-type well 72, while the N-channel MOS transistor N51 is formed in the P-type well 74.

Specifically, the MOS transistor N50 includes an N$^+$-type source region 80, an N$^+$-type drain region 82, a P$^+$-type contact region 84, and a P$^+$-type contact region 86, which are formed in a surface side of the P-type well 72. A gate insulating film 88 is formed on the well 72 between the source region 80 and the drain region 82, and a gate electrode 90 is formed on this gate insulating film 88.

Similarly, the MOS transistor N51 includes an N$^+$-type source region 100, an N$^+$-type drain region 102, a P$^+$-type contact region 104, and a P$^+$-type contact region 106, which are formed in a surface side of the P-type well 74. A gate insulating film 108 is formed on the well 74 between the source region 100 and the drain region 102, and a gate electrode 110 is formed on this gate insulating film 108.

Then, the gate electrode 90 of the MOS transistor N50 is connected to the power supply voltage VDD. A source region 80, a drain region 82, a contact region 84, a contact region 86 of the MOS transistor N50, and a gate electrode 110 of the MOS transistor N51 are connected to the output node that outputs the intermediate voltage output OUT. A source region 100, a drain region 102, a contact region 104, and a contact region 106 of the MOS transistor N51 are connected to the ground. Here, the power supply voltage VDD has higher voltage than the ground.

In FIG. 7, when a voltage level of the intermediate voltage output OUT is half of the power supply voltage VDD, the MOS transistor N50 and the MOS transistor N51 may be formed to be equal in size.

In a case of setting the voltage level of the intermediate voltage output OUT to a level other than the above, an area ratio of the gate insulating film 88 on the MOS transistor N50 to the gate insulating film 108 on the MOS transistor N51 may be adjusted, which is similar to the above-described first embodiment. In order to reduce variations in the gate insulating film leak current by the MOS transistors, it is desirable that the MOS transistor is made into an ON-state and a channel is formed under the gate electrode, which is also similar to the above-described first embodiment. Therefore, when plural kinds of the MOS transistors having different thresholds are formed in the semiconductor device, it is preferable to use, among the plural MOS transistors, the MOS transistor having the least threshold as the resistive element according to the present embodiment.

As described above, similar to the above-described first embodiment, the semiconductor device according to this embodiment can also realize a resistive element having high resistance without adding an extra process to a semiconductor device manufacturing process. This also allows to realize the resistive element having high resistance with small area, comparing to a conventional case of using an impurity diffused layer as the resistive element or using a polysilicon layer as the resistive element.

Fourth Embodiment

A fourth embodiment employs a voltage generating circuit of a voltage variable type including an N-channel MOS transistor, instead of the P-channel MOS transistor used in the above-described second embodiment.

Figure 8:
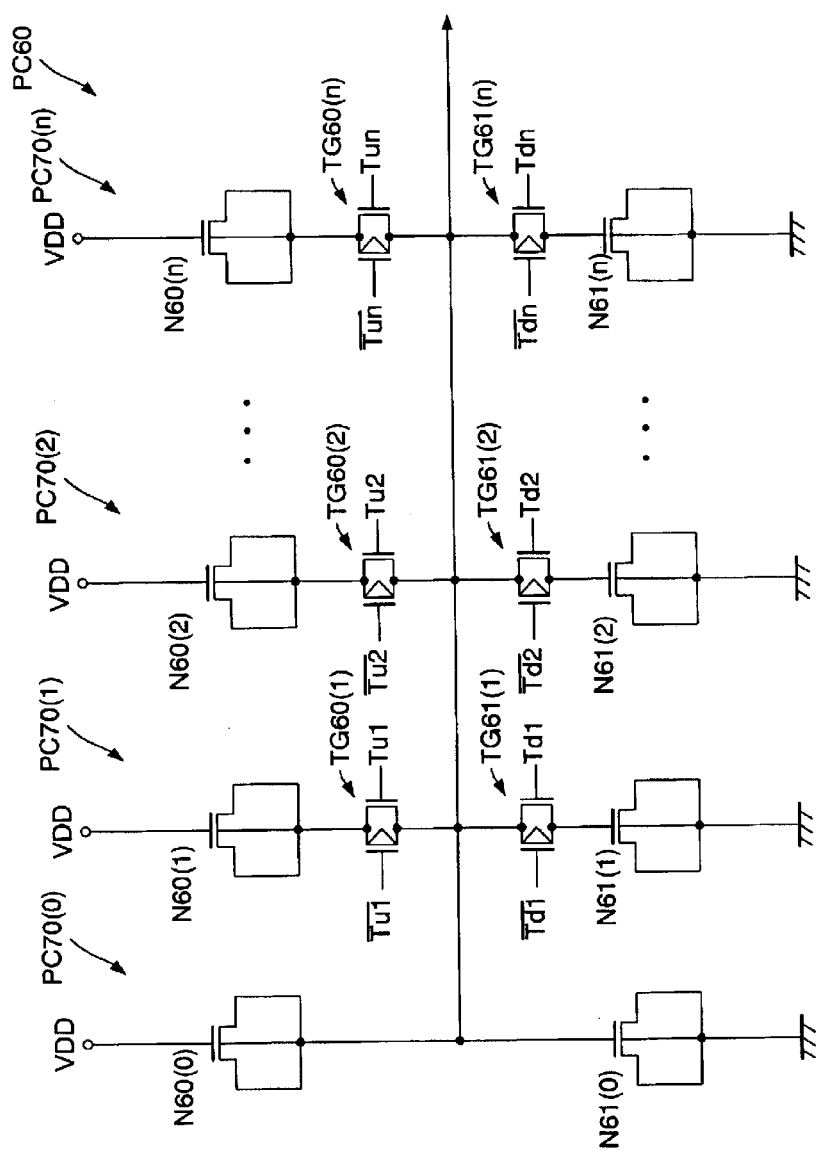
FIG. 8 is a circuit diagram of a voltage generating circuit according to a fourth embodiment.

FIG. 8 is a circuit diagram showing a structure of a voltage generating circuit PC60 according to this embodiment. As shown in FIG. 8, in the voltage generating circuit PC60 according to this embodiment, voltage generating circuits PC70(0) to PC70(n), the plural numbers of which are connected in parallel, are composed by using N-channel MOS transistors N60(0) to N60(n) and N-channel MOS transistors N61(0) to N61(N) as resistive elements. The voltage generating circuit PC70(1) has a transfer gate TG60 (1) connected between the MOS transistor N60(1) and an output node, while a transfer gate TG61(1) is connected between the output node and the MOS transistor N61(11). The same applies to the other voltage generating circuits PC70(2) to PC70(n). The points other than the above are similar to the second embodiment. That is, also in this embodiment, the thickness of the gate insulating films of the MOS transistors constituting the transfer gates TG60(1) to TG60(n) and TG61(1) to TG61(n) is thicker than the thickness of the gate insulating films 10 of the MOS transistors N60(0) to N60(n) and N61(0) to N61(n) constituting the resistive element.

Similar to the above-described second embodiment, the semiconductor device according to this embodiment also controls the number of the MOS transistors, which are connected to the output nodes for outputting the intermediate voltage output OUT, with the use of the trimming signals Tu1 to Tun, the inverted trimming signals/Tu1 to /Tun, the trimming signals Td1 to Tdn, and the inverted trimming signals /Td1 to /Tdn. This allows to adjust the voltage level of the intermediate voltage output OUT.

Fifth Embodiment

A fifth embodiment of the present employs a triple well structure to form a P-channel MOS transistor used as a resistive element on an N-type semiconductor substrate, and to form N-channel MOS transistors on a P-type semiconductor substrate.

Figure 9:
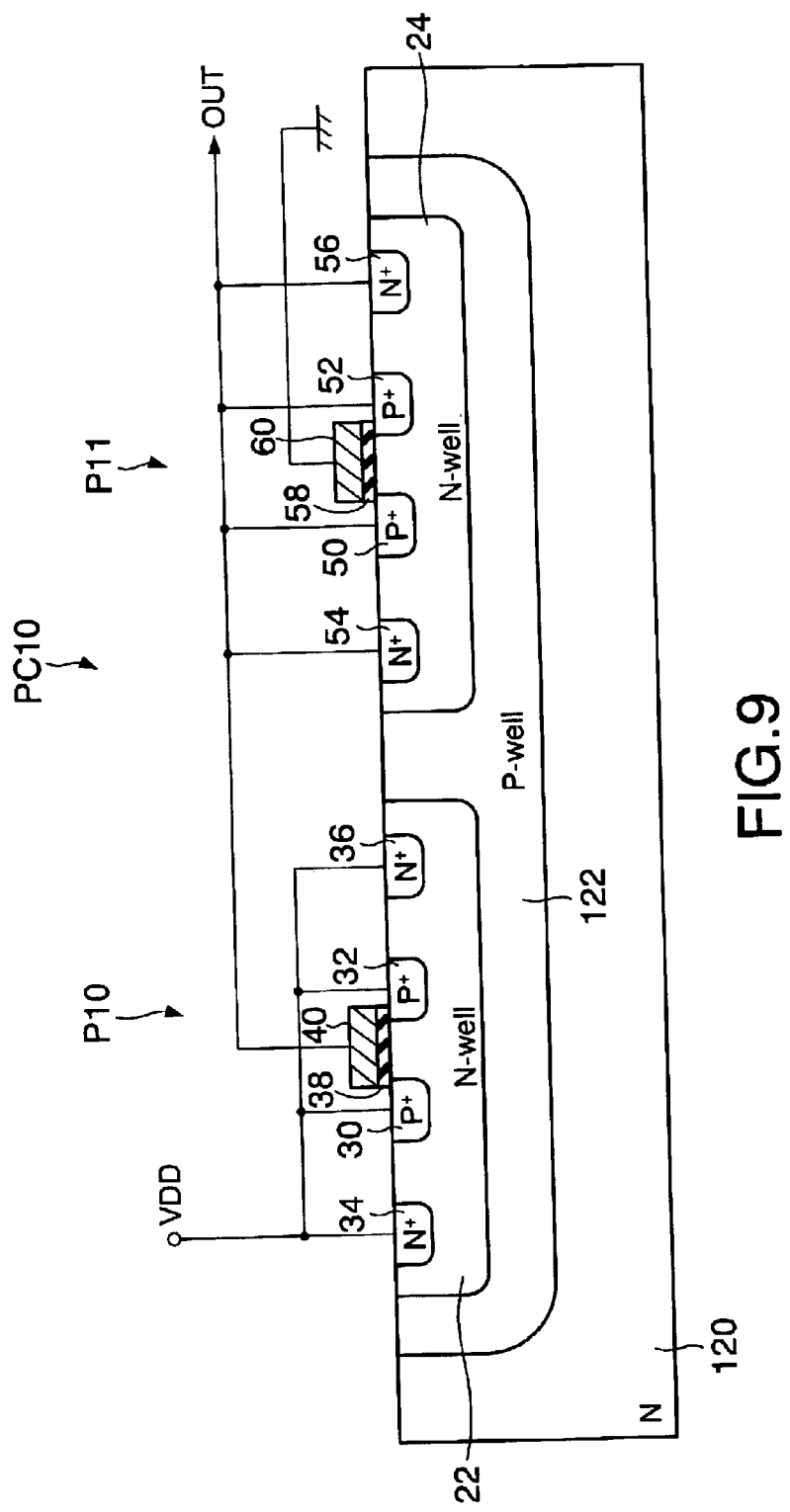
FIG. 9 is a sectional view of the semiconductor device in a case where the voltage generating circuit according to the first embodiment is formed on an N-type semiconductor substrate (fifth embodiment)

FIG. 9 is a schematic view showing a cross section of a semiconductor device in which the N-type semiconductor substrate is used to form the P-channel MOS transistor, the P-channel MOS transistor being used as the resistive element. As shown in FIG. 9, a P-type well 122 is formed in a surface side of an N-type semiconductor substrate 120. An N-type well 22 and an N-type well 24 are formed in a surface side of the P-type well 122. The points other than the above are equal to the structure shown in FIG. 4 in the above-described first embodiment.

Figure 10:
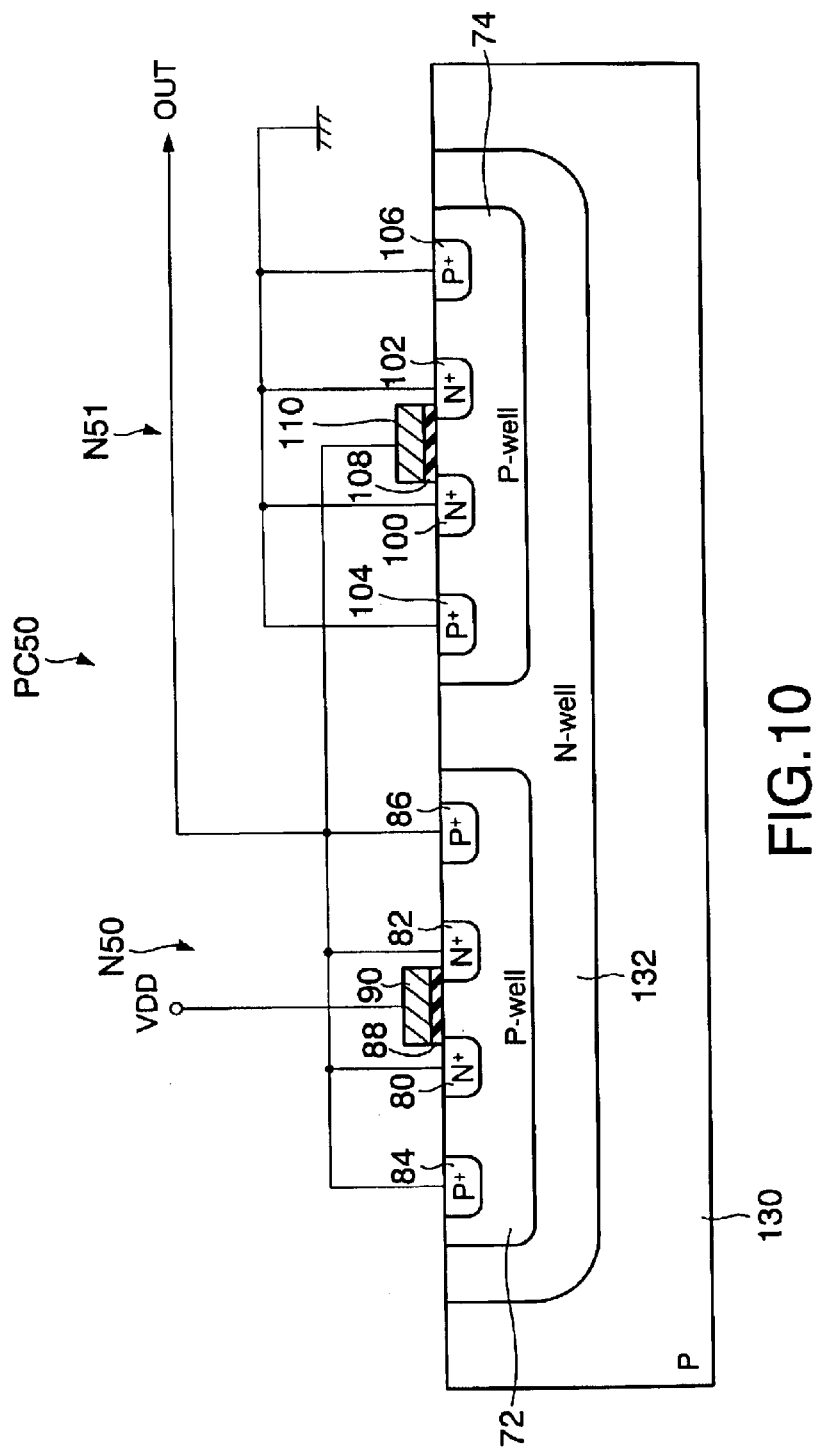
FIG. 10 is a sectional view of the semiconductor device in a case where the voltage generating circuit according to the third embodiment is formed on a P-type semiconductor substrate (fifth embodiment)

FIG. 10 is a schematic view showing a cross section of a semiconductor device in which the P-type semiconductor substrate is used to form the N-channel MOS transistor, the N-channel MOS transistor being used as the resistive element. As shown in FIG. 10, an N-type well 132 is formed in a surface side of a P-type semiconductor substrate 130. A P-type well 72 and a P-type well 74 are formed in a surface side of the N-type well 132. The points other than the above are equal to the structure shown in FIG. 7 in the above-described third embodiment.

According to this embodiment as shown in FIG. 9, the triple well structure allows to form on the N-type semiconductor substrate 120 P-channel MOS transistors P10 and P11 that are used as the resistive elements. In addition, as shown in FIG. 10, the triple well structure allows to form on the P-type semiconductor substrate 130 N-channel MOS transistors N50 and N51 that are used as the resistive elements.

Sixth Embodiment

A gate insulating film leak current does not have big difference in its determination between an N-channel MOS transistor and a P-channel MOS transistor. Therefore, this embodiment employs two MOS transistors used as resistive elements in a voltage generating circuit, one of which being an N-channel, while the other being a P-channel.

Figure 11:
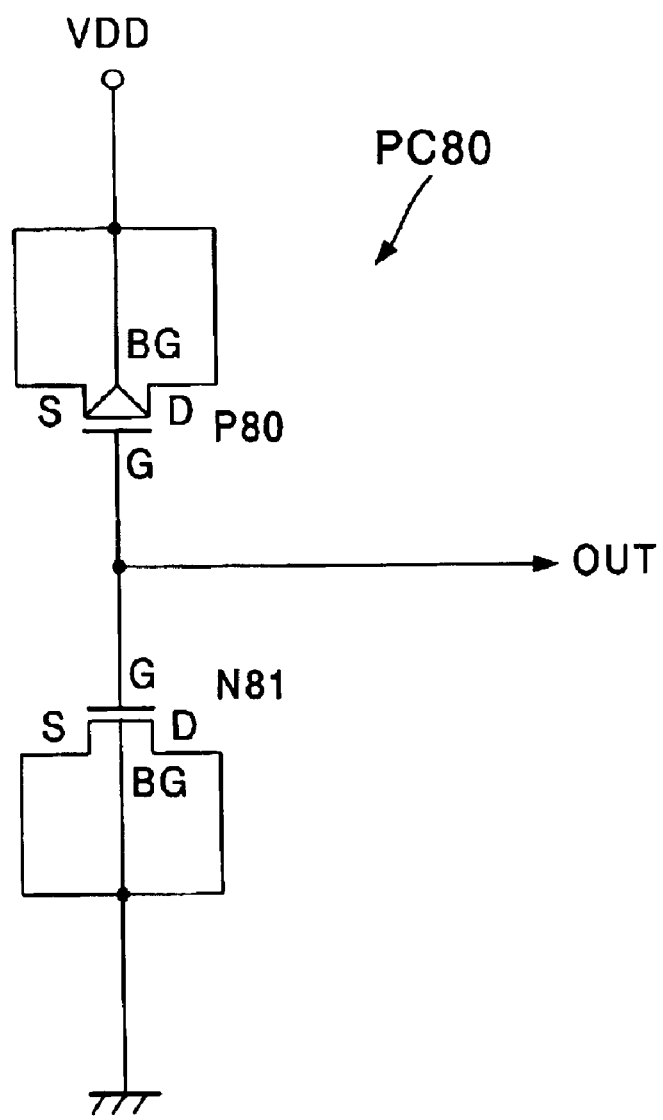
FIG. 11 is a circuit diagram of a voltage generating circuit according to a sixth embodiment.

FIG. 11 is a circuit diagram showing a structure of a voltage generating circuit PC80 according to this embodiment. As shown in FIG. 11, the voltage generating circuit PC80 according to this embodiment includes a P-channel MOS transistor P80 and an N-channel MOS transistor N81. A source terminal S, a drain terminal D, and a back gate terminal BG of the MOS transistor P80 are commonly connected to power supply voltage VDD. A gate terminal G of the MOS transistor P80 is connected to a gate terminal G of the MOS transistor N81.

A source terminal S, a drain terminal D, and a back gate terminal BG of the MOS transistor N81 are commonly connected to the ground. Then, a node between the MOS transistor P80 and the MOS transistor N81 becomes an output node outputting intermediate voltage output OUT.

Figure 12:
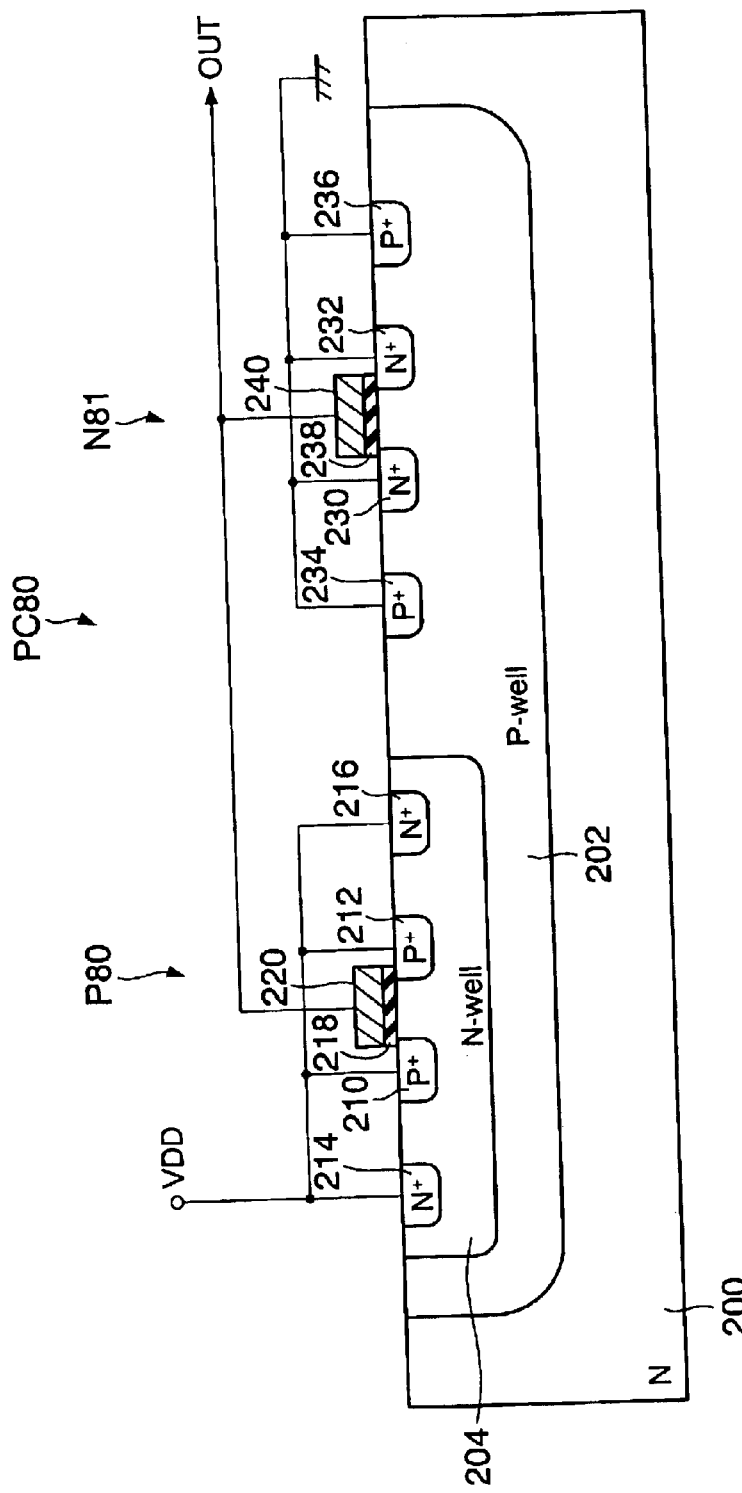
FIG. 12 is a sectional view of the semiconductor device in a case where the voltage generating circuit according to the sixth embodiment is formed on an N-type semiconductor substrate.

FIG. 12 is a schematic view showing a cross section of a semiconductor device of the voltage generating circuit PC80 shown in FIG. 11. As shown in FIG. 12, a CMOS process using an N-type semiconductor substrate 200 allows to form a P-type well 202 in the N-type semiconductor substrate 200, and to form an N-type well 204 in a portion of this P-type well 202. Then, a P-channel MOS transistor P80 is formed in the N-type well 204, while an N-channel MOS transistor N81 is formed in a region of the P-type well 202 where the N-type well 204 is not formed.

Specifically, the P-channel MOS transistor P80 includes a P+-type source region 210, a P+-type drain region 212, an N+-type contact region 214, and an N+-type contact region 216, which are formed in a surface side of the N-type well 204. A gate insulating film 218 is formed on the well 204 between the source region 210 and the drain region 212, and a gate electrode 220 is formed on this gate insulating film 218.

On the other hand, the N-channel MOS transistor N81 includes an N+-type source region 230, an N+-type drain region 232, a P+-type contact region 234, and a P+-type contact region 236, which are formed in a surface side of the P-type well 202. A gate insulating film 238 is formed on the well 202 between the source region 230 and the drain region 232, and a gate electrode 240 is formed on this gate insulating film 238.

The source region 210, the drain region 212, the contact region 214, and the contact region 216 of the MOS transistor P80 are connected to the power supply voltage VDD. The gate electrode 220 of the MOS transistor P80 and the gate electrode 240 of the MOS transistor N81 are connected to the output node outputting the intermediate voltage output OUT. The source region 230, the drain region 232, the contact region 234, and the contact region 236 of the MOS transistor N81 are connected to the ground. Here, the power supply voltage VDD has higher voltage than the ground.

In FIG. 12, when a voltage level of the intermediate voltage output OUT is half of the power supply voltage VDD, the MOS transistor P80 and the MOS transistor N81 may be formed to be equal in size.

Figure 13:
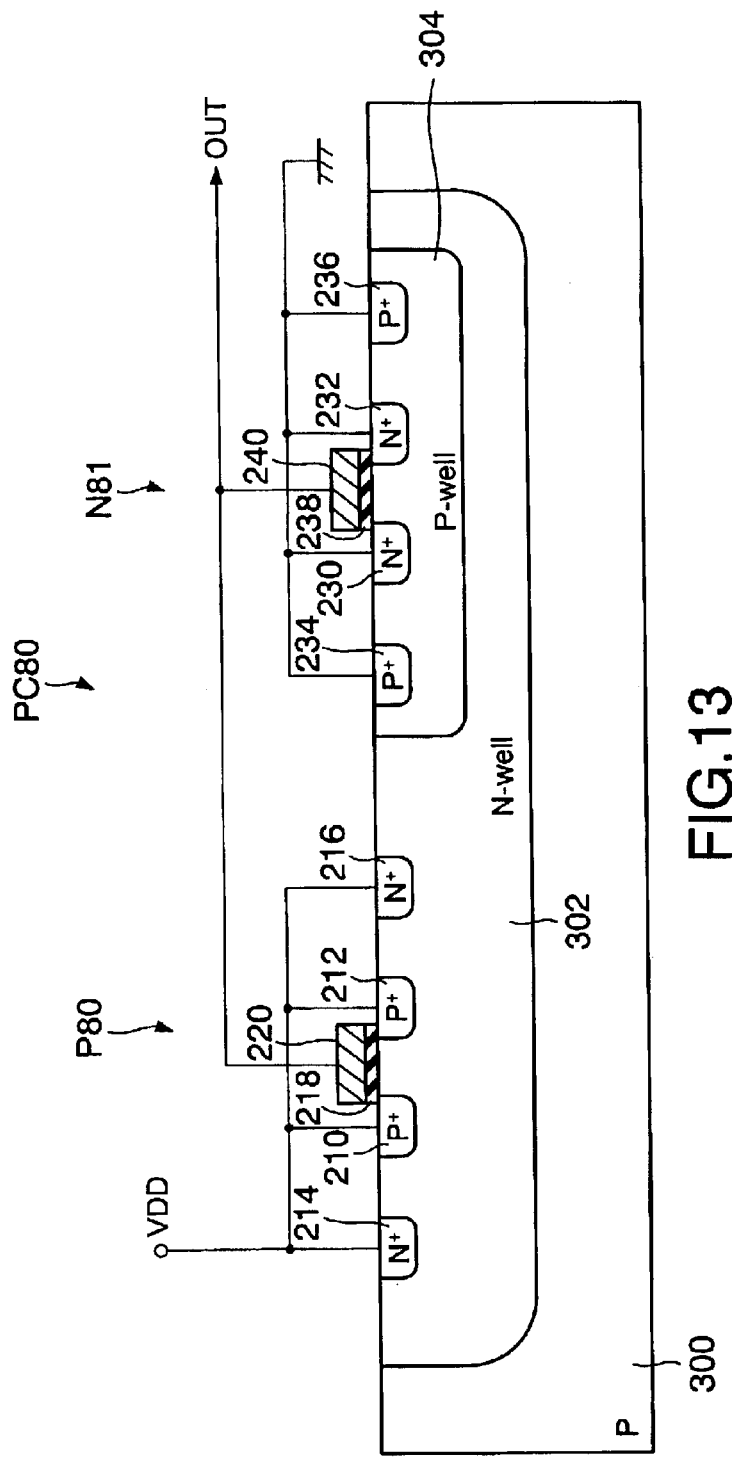
FIG. 13 is a sectional view of the semiconductor device in a case where the voltage generating circuit according to the sixth embodiment is formed on a P-type semiconductor substrate.

Note that FIG. 13 shows a sectional view of such a case as to form this voltage generating circuit PC80 on a P-type semiconductor substrate 300. Specifically, an N-type well 302 is formed in the P-type semiconductor substrate 300, while a P-type well 304 is formed in a portion of this N-type well 302. Then, a P-channel MOS transistor P80 is formed in the N-type well 302, while an N-channel MOS transistor N81 is formed in the P-type well 304.

This embodiment is similar to the above-described first and third embodiments, except for using a combination of the P-channel MOS transistor P80 and the N-channel MOS transistor N81 as the resistive element.

Figure 14:
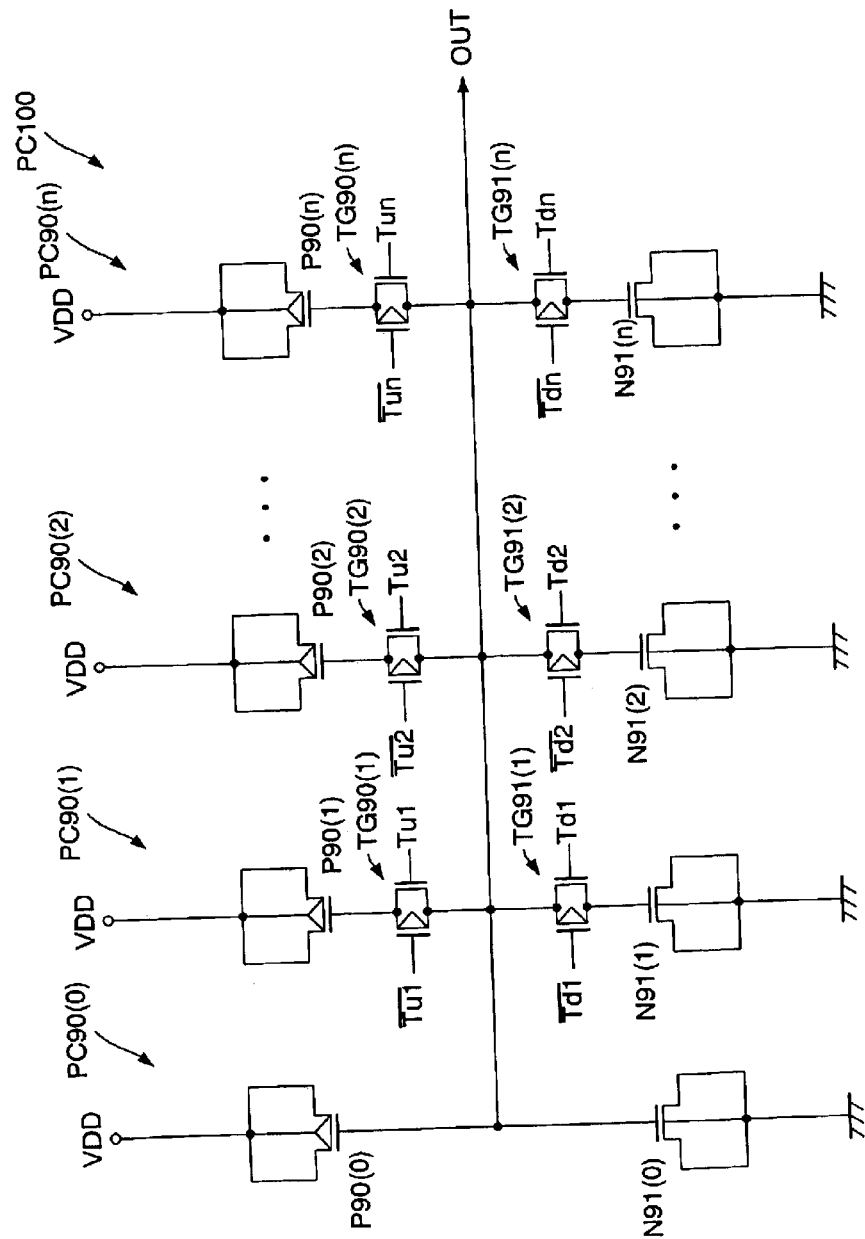
FIG. 14 a circuit diagram of a voltage generating circuit when the sixth embodiment is combined with the second embodiment.

Similar to the above-described second embodiment, this embodiment can also make a to-be-generated voltage level variable by selectively using the plural MOS transistors. Specifically, as shown in FIG. 14, a voltage generating circuit PC100 includes voltage generating circuits PC90(0) to PC90(n), the plural numbers of which are connected in parallel. The voltage generating circuits PC90(0) to PC90(n) each use the P-channel MOS transistors P90(0) to P90(n) and the N-channel MOS transistors N91(0) to N91(n) as resistive elements. The voltage generating circuit PC90(1) has a transfer gate TG90(1) connected between the MOS transistor P90(1) and an output node, while a transfer gate TG91(1) is connected between the output node and the MOS transistor N91(1). The same applies to the other voltage generating circuits PC90(2) to PC90(n). The points other than the above are similar to the above-described second embodiment. That is, also in this embodiment, the thickness of the gate insulating films of the MOS transistors constituting the transfer gates TG90(1) to TG90(n) and TG91(1) to TG91(n) is thicker than the thickness of the gate insulating films 10 of the MOS transistors N90(0) to N90(n) and N91(0) to N91(n) constituting the resistive element.

Similar to the above-described second embodiment, this structure enables to control the number of the MOS transistors, which are connected to the output nodes for outputting the intermediate voltage output OUT, with the use of trimming signals Tu1 to Tun, inverted trimming signals/Tu1 to /Tun, trimming signals Td1 to Tdn, and inverted trimming signals/Td1 to /Tdn. This allows to adjust the voltage level of the intermediate voltage output OUT.

Note that the present invention is not limited to the above embodiments and variations thereof may be accepted. For example, although each of the above-described embodiments describes an example of connecting the MOS transistors, which constitute the resistive elements, in double series, the MOS transistors may be connected in plural tiers such as three tiers, four tiers, and the like.

Additionally, each of the above-described embodiments describes an example in which the MOS transistors are used as the resistive elements for a resistance division circuit and this resistance division circuit composes the voltage generating circuit that generates the intermediate voltage, but the MOS transistors can be used as the resistive elements in other resistance division circuits. Further, it is possible to simply use one MOS transistor as one resistive element.

Additionally, in each of the above-described embodiments, a node having a higher voltage is regarded as a voltage supplied from the power supply voltage VDD, while a node having a lower voltage is regarded as a ground voltage, but high-low relation in the voltage is not limited thereto. For example, the lower voltage may be used as power supply (second power supply) of a voltage other than that of the ground.

Figure 15:
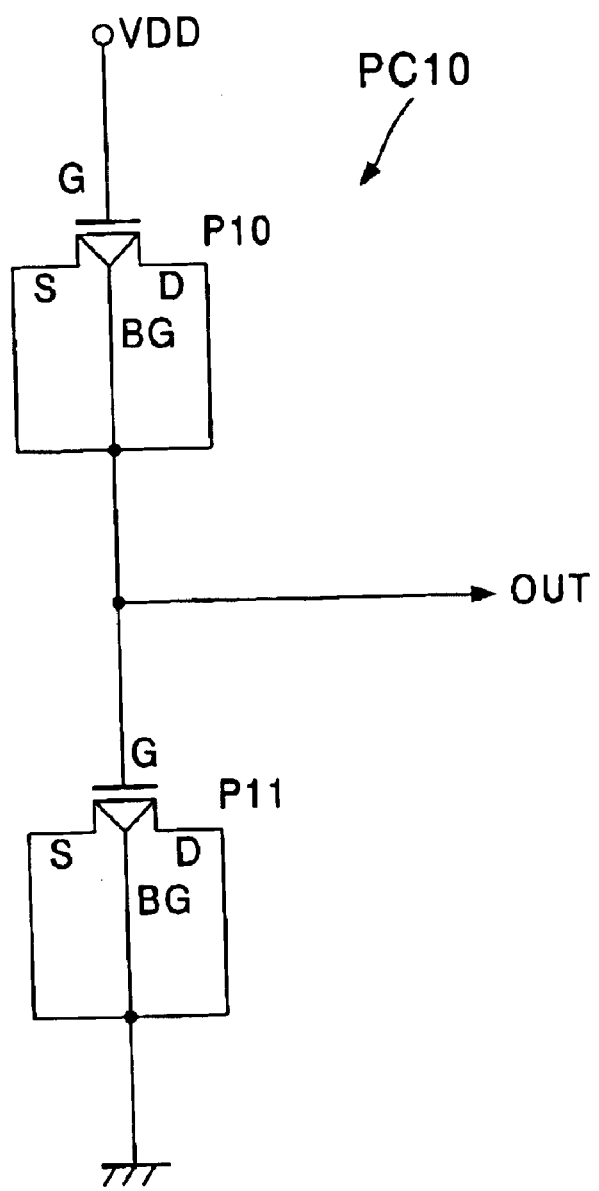
FIG. 15 is a circuit diagram of a voltage generating circuit in which a connecting relationship of the MOS transistor is reversed.
Figure 16:
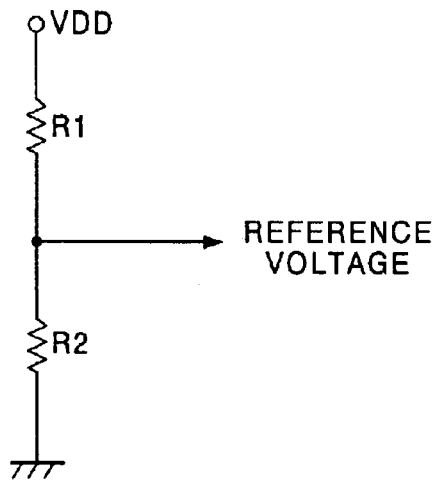
FIG. 16 is a circuit diagram of a related voltage generating circuit.
Figure 17:
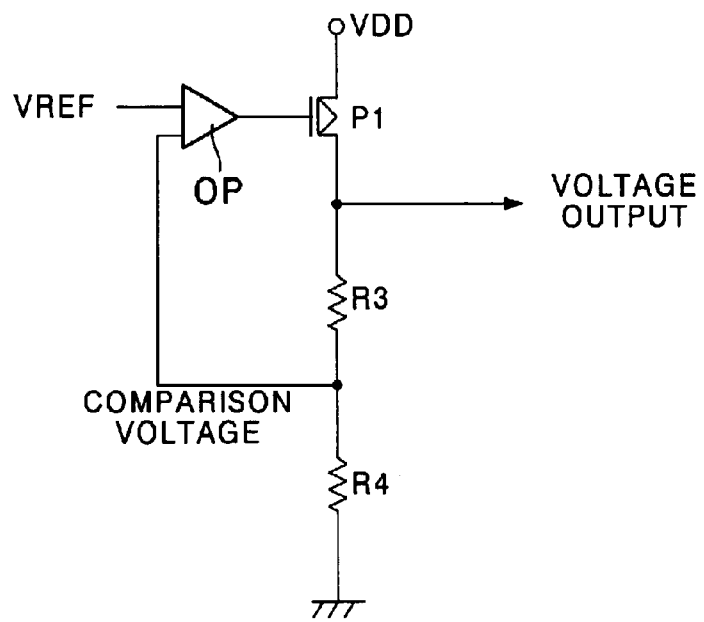
FIG. 17 is a circuit diagram of a related output voltage generating circuit.

Further, in each of the above-described embodiments, the MOS transistor is connected in a direction where the MOS transistor is made into an ON-state in order to reduce variations in a gate insulating film leak current, but it is acceptable to connect the MOS transistor in a direction where it is made into an OFF-state. Specifically, for example, the voltage generating circuit PC10 in FIG. 3 may take such design as shown in FIG. 15 that a gate terminal G in a P-channel MOS transistor is connected to power supply voltage VDD, a gate terminal in a P-channel MOS transistor P11 is connected to a source terminal S, a drain terminal D, and a back gate terminal BG in the P-channel MOS transistor P10, and a source terminal S, a drain terminal D, and a back gate terminal BG in the P-channel MOS transistor P11 are connected to the ground.

Additionally, in the above-mentioned FIG. 5A, FIG. 8, and FIG. 14, only one voltage generating circuit that has no transfer gates therein, namely the voltage generating circuits PC30(0), PC70(0), and PC90(0) each, is provided, but it is not indispensable. This means that all voltage generating circuits may be provided with the transfer gates. Contrary to this, it is acceptable to provide plural voltage generating circuits with no transfer gates provided.

Further, FIG. 5A, FIG. 8, and FIG. 14 use as switching circuits the transfer gates having the N-channel MOS transistor and the P-channel MOS transistor, but switching circuits having other structures may be used as long as the ON/OFF-states of continuity between the MOS transistor being the resistive element and the output node can be switched.

Additionally, in the above-mentioned embodiments, the gate insulating film is not limited to a silicon oxide (SiO$_2$) film, but it can be formed of materials of ON and so on. That is, the present invention can be applied to a MIS transistor (Metal Insulator Semiconductor Transistor) with a gate insulating film.

What is claimed is:

1. A resistance division circuit, comprising:
   a first MIS transistor having a first gate terminal, a first source terminal, a first drain terminal and a first back gate terminal, wherein the first gate terminal is regarded as a first terminal, and the first source terminal, the first drain terminal and the first back gate terminal are regarded as a second terminal, and one of the first terminal and the second terminal is connected to a first node of a first voltage; and
   a second MIS transistor having a second gate terminal, a second source terminal, a second drain terminal and a second back gate terminal, wherein the second gate terminal is regarded as a third terminal, and the second source terminal, the second drain terminal and the second back gate terminal are regarded as a fourth terminal, and one of the third terminal and the fourth terminal is connected to the other of the first terminal and the second terminal and the other of the third terminal and the fourth terminal is connected to a second node of a second voltage.

2. The resistance division circuit according to claim 1, wherein the first voltage is higher than the second voltage.

3. The resistance division circuit according to claim 2, wherein the first and second MIS transistors are P-channel MIS transistors.

4. The resistance division circuit according to claim 3, wherein the second terminal is connected to the first node, the first terminal is connected to the fourth terminal, and the third terminal is connected to the second node.

5. The resistance division circuit according to claim 2, wherein the first and second MIS transistors are N-channel MIS transistors.

6. The resistance division circuit according to claim 5, wherein the first terminal is connected to the first node, the second terminal is connected to the third terminal, and the fourth terminal is connected to the second node.

7. The resistance division circuit according to claim 2, wherein the first MIS transistor is a P-channel MIS transistor and the second MIS transistor is an N-channel MIS transistor.

8. The resistance division circuit according to claim 7, wherein the second terminal is connected to the first node, the first terminal is connected to the third terminal, and the fourth terminal is connected to the second node.

9. The resistance division circuit according to claim 1, wherein a node between the first MIS transistor and the second MIS transistor is an output node, and a voltage between the first voltage and the second voltage is drawn from the output node.

10. The resistance division circuit according to claim 9, further comprising:
    a first switching circuit connected between the first MIS transistor and the output node to perform ON/OFF control of continuity between the first MIS transistor and the output node; and
    a second switching circuit connected between the second MIS transistor and the output node to perform ON/OFF control of continuity between the second MIS transistor and the output node.

11. The resistance division circuit according to claim 10, wherein the first switching circuit comprises a third MIS transistor of P-channel and a fourth MIS transistor of N-channel, and
    the second switching circuit comprises a fifth MIS transistor of P-channel and a sixth MIS transistor of N-channel.

12. The resistance division circuit according to claim 11, wherein gate insulating films of the third MIS transistor, the fourth MIS transistor, the fifth MIS transistor and the sixth MIS transistor are thicker than gate insulating films of the first MIS transistor and the second MIS transistor.

13. A trimming type resistance division circuit, comprising the plural resistance division circuits according to claim 12, wherein the output node of each resistance division circuit is connected in common.

14. A semiconductor device, comprising the resistance division circuit according to claim 1.

15. A semiconductor device according to claim 14, wherein plural kinds of MIS transistors having different thresholds are formed in the semiconductor device, and each of the first and second MIS transistors is a MIS transistor having the least threshold among the plural kinds of MIS transistors.

16. A semiconductor device including a first MIS transistor and a second MIS transistor, wherein
the first MIS transistor comprises:
a first well region formed in a surface side of a semiconductor substrate, the first well being connected to one of a first node of a first voltage and an output node;
a first source region formed in the surface side of the first well region, the first source region being connected to the one of the first node and the output node;
a first drain region formed in the surface side of the first well region, the first drain region being connected to the one of the first node and the output node; and
a first gate electrode formed on the first well region between the first source region and the first drain region via a first insulating film, the first gate electrode being connected to the other of the first node and the output node, and
the second MIS transistor comprises:
a second well region formed in the surface side of the semiconductor substrate, the second well being connected to one of the output node and a second node of a second voltage;
a second source region formed in the surface side of the second well region, the second source region being connected to the one of the output node and the second node;
a second drain region formed in the surface side of the second well region, the second drain region being connected to the one of the output node and the second node; and
a second gate electrode formed on the second well region between the second source region and the second drain region via a second insulating film, the second gate electrode being connected to the other of the output node and the second node.

17. The semiconductor device according to claim 16, wherein the first voltage is higher than the second voltage.

18. The semiconductor device according to claim 17, wherein each of the first well region and the second well region is of N-type, and each of the first source region, the first drain region, the second source region and the second drain region is of P-type.

19. The semiconductor device according to claim 18, wherein the first well region, the first source region and the first drain region are connected to the first node, and the first gate electrode is connected to the output node, and
the second well region, the second source region and the second drain region are connected to the output node, and the second gate electrode is connected to the second node.

20. The semiconductor device according to claim 17, wherein each of the first well region and the second well region is of P-type, and each of the first source region, the first drain region, the second source region and the second drain region is of N-type.

21. The semiconductor device according to claim 20, wherein the first well region, the first source region and the first drain region are connected to the output node, and the first gate electrode is connected to the first node, and
the second well region, the second source region and the second drain region are connected to the second node, and the second gate electrode is connected to the output node.

22. The semiconductor device according to claim 17, wherein the first well region is of N-type and each of the first source region and the first drain region is of P-type, and
the second well region is of P-type and each of the second source region and the second drain region is of N-type.

23. The semiconductor device according to claim 22, wherein the first well region, the first source region and the first drain region are connected to the first node, and the first gate electrode is connected to the output node, and
the second well region, the second source region and the second drain region are connected to the second node, and the second gate electrode is connected to the output node.

24. The semiconductor device according to claim 16, further comprising:
a first switching circuit connected between the first MIS transistor and the output node to perform ON/OFF control of continuity between the first MIS transistor and the output node; and
a second switching circuit connected between the second MIS transistor and the output node to perform ON/OFF control of continuity between the second MIS transistor and the output node.

25. The semiconductor device according to claim 24, wherein the first switching circuit comprises a third MIS transistor of P-channel and a fourth MIS transistor of N-channel, and
the second switching circuit comprises a fifth MIS transistor of P-channel and a sixth MIS transistor of N-channel.

26. The semiconductor device according to claim 25, wherein gate insulating films of the third MIS transistor, the fourth MIS transistor, the fifth MIS transistor and the sixth MIS transistor are thicker than the first gate insulating film and the second gate insulating film.

27. A semiconductor device, comprising a MIS transistor having a gate terminal, a source terminal, a drain terminal and a back gate terminal, wherein the gate terminal is regarded as a first terminal, and the source terminal, the drain terminal and the back gate terminal are regarded as a second terminal, one of the first terminal and the second terminal being connected to a first node, while the other of the first terminal and the second terminal being connected to a second node; and
wherein the MIS transistor is used as a resistive element.

* * * * *